(12) United States Patent
Luk et al.

(10) Patent No.: US 7,895,430 B2
(45) Date of Patent: Feb. 22, 2011

(54) ON-CHIP LOGIC ANALYZER USING COMPRESSION

(75) Inventors: King Wayne Luk, Roseville, CA (US); Mark Allen Gravel, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 850 days.

(21) Appl. No.: 11/880,913

(22) Filed: Jul. 24, 2007

(65) Prior Publication Data

US 2009/0031159 A1    Jan. 29, 2009

(51) Int. Cl.
*G06F 1/04* (2006.01)
*G06F 15/177* (2006.01)

(52) U.S. Cl. .................. 713/2; 713/500; 713/502

(58) Field of Classification Search .......... 713/500, 713/502
See application file for complete search history.

(56) References Cited

U.S. PATENT DOCUMENTS

| | | | |
|---|---|---|---|
| 5,867,114 A * | 2/1999 | Barbir | 341/107 |
| 6,816,093 B1 * | 11/2004 | Jaquette | 341/51 |
| 7,103,530 B1 | 9/2006 | Bartz et al. | |
| 7,149,640 B2 | 12/2006 | Lawrence et al. | |
| 7,225,359 B2 | 5/2007 | Beck et al. | |
| 7,627,784 B1 * | 12/2009 | Allen et al. | 714/30 |
| 2003/0097615 A1 * | 5/2003 | Corti et al. | 714/37 |
| 2006/0190758 A1 * | 8/2006 | Wickeraad | 713/600 |
| 2006/0294441 A1 * | 12/2006 | Cheng et al. | 714/718 |
| 2008/0114793 A1 * | 5/2008 | Grosset et al. | 707/101 |

* cited by examiner

*Primary Examiner*—Nitin C Patel

(57) ABSTRACT

One embodiment disclosed relates to an integrated circuit including on-chip logic analyzer circuitry. The on-chip logic analyzer circuitry includes a triggering circuit configured to receive a source data signal and start/stop timing signals. The on-chip logic analyzer circuitry further includes a compression circuit configured to receive an uncompressed data signal from the triggering circuit and to perform compression so as to form a compressed data signal. Other embodiments, aspects and features are also disclosed.

28 Claims, 10 Drawing Sheets

FIG. 6    600

ON-CHIP LOGIC ANALYZER USING COMPRESSION

BACKGROUND OF THE INVENTION

1. Field of the Invention

The present invention relates generally to electronics and semiconductor circuits.

2. Description of the Background Art

A logic analyzer is an important tool for engineers to debug digital systems. A typical logical analyzer tool is an expensive piece of equipment which requires set up time to configure probe pins, and so forth.

Applicants have observed that these logic analyzer tools are in a difficult race to keep up with rising on-chip frequencies. Rising on-chip frequencies are problematic because the logic analyzer tools are subject to constraints because of their limited bandwidth for capturing data signals.

Prior solutions for monitoring internal chip nodes may involve on-chip routing of trace/monitor data signals to an output chip port or temporary storage of the data signals in on-chip random access memory (RAM) buffers with limited storage capacity. In either case, valuable integrated circuit pins are needed to bring the data signals out so that the logic analyzer tool may capture them. Moreover, dedicated monitor pins are typically not available in production systems, making debugging even more difficult for field failures.

It is highly desirable to overcome the above-discussed limitations and difficulties with using logic analyzers to debug digital systems.

DETAILED DESCRIPTION

The present application discloses methods and apparatus which may be utilized to overcome the aforementioned limitations and difficulties. Advantages of the techniques disclosed herein include the following.

First, the technology described herein provides the capability for high-bandwidth data capture by storing data in relatively inexpensive system DRAM, rather than expensive on-chip SRAM. This capability is enabled by the compressed form of the monitoring data which effectively increases the bandwidth of the data capture.

Second, the technology described herein provides for particularly efficient data capture using combinations of triggering, filtering, timestamp, and compression techniques. These techniques may be advantageously applied to reduce memory storage requirements and effective capture data path bandwidth.

Third, the technology described herein provides easy access to the monitoring data because the data capture subsystem is self-contained such that no dedicated external debug ports are necessary. Hence, the monitoring data may be readily accessed by the on-chip CPU with no or minimal additional hardware circuitry.

Figure 1:
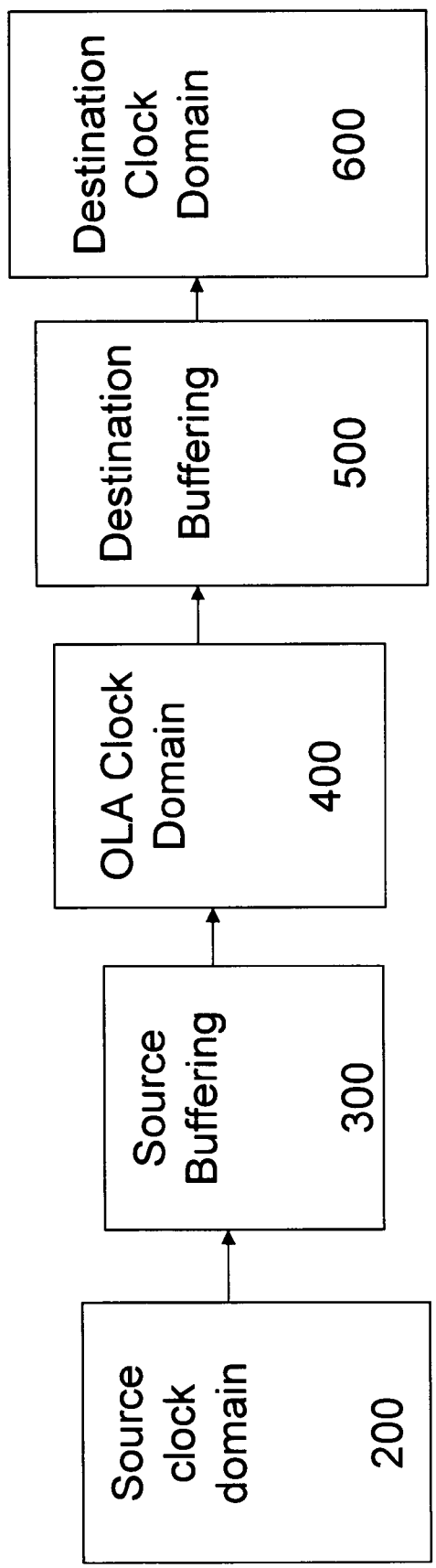
FIG. 1 is a high-level schematic diagram of an on-chip logic analyzer system in accordance with an embodiment of the invention.

FIG. 1 is a high-level schematic diagram of an on-chip logic analyzer system 100 in accordance with an embodiment of the invention. As shown, the system 100 includes circuitry which may be divided into multiple clock domains and buffering circuits therebetween.

More particularly, as shown in FIG. 1, the clock domains may include a source clock domain 200, an on-chip logic analyzer (OLA) clock domain 400, and a destination clock domain 600. Source buffering circuitry 300 provides a buffer between the source clock domain 200 and the OLA clock domain 400. Destination buffering circuitry 500 provides a buffer between the OLA clock domain 400 and the destination clock domain 600.

Figure 2:
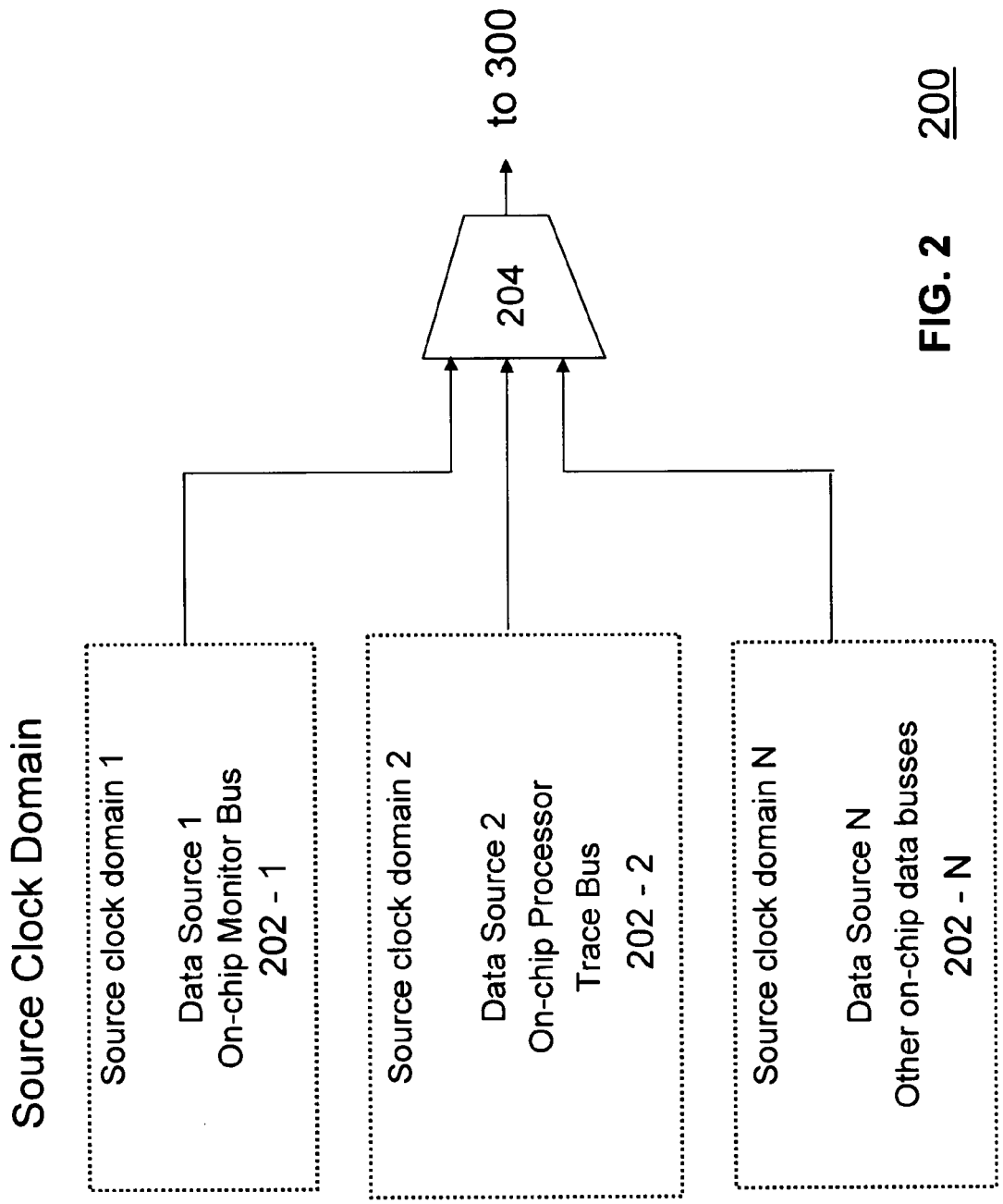
FIG. 2 is a schematic diagram of source clock domain circuitry in accordance with an embodiment of the invention.

FIG. 2 is a schematic diagram of circuitry for the source clock domain 200 in accordance with an embodiment of the invention. As shown, the source clock domain circuitry may include multiple data sources 202-1 through 202-N, where each data source 202 may have its own clock domain. For example, data source 1 202-1 may be an on-chip monitor bus, and data source 2 202-2 may be an on-chip processor trace bus. As indicated by block 202-N, other data sources may be other on-chip data busses.

Output from a specific data source 202 may be selected using a controllable data selector circuit 204. As shown, the selected output may be transmitted to the source buffering circuitry 300. Advantageously, the circuit module shown in FIG. 2 provides for users to select amongst various on-chip signals to be monitored.

Figure 3:
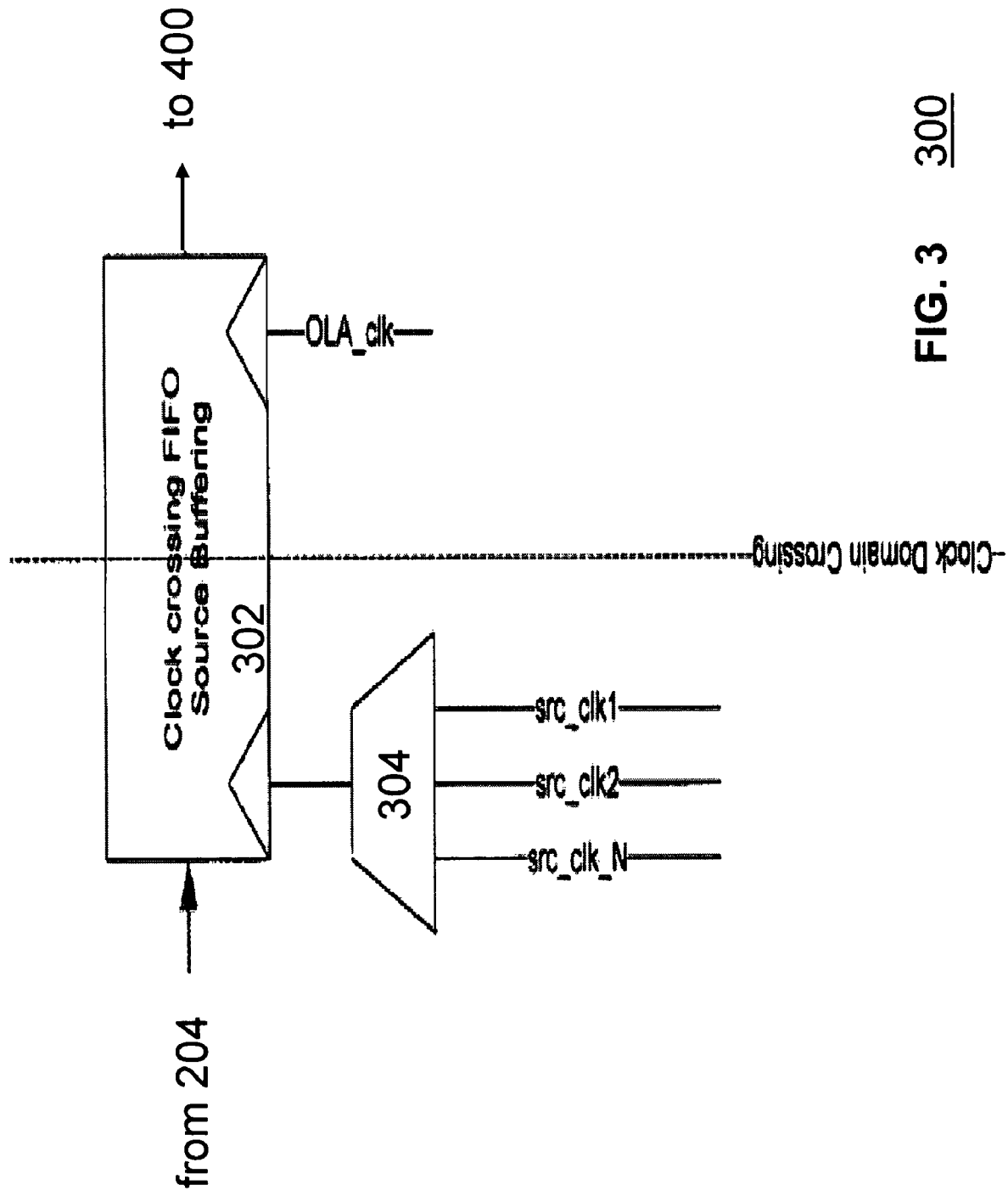
FIG. 3 is a schematic diagram of source buffering circuitry in accordance with an embodiment of the invention.

FIG. 3 is a schematic diagram of source buffering circuitry 300 in accordance with an embodiment of the invention. As depicted, a clock crossing first-in-first-out (FIFO) source buffering circuit 302 receives the source data signal output by the data selector circuit 204 of FIG. 2. The FIFO source buffering circuit 302 also receives two clock signal inputs.

A first clock signal input may be received from a clock selector circuit 304, where the source clock selector circuit 304 may output a source clock signal which corresponds to the source data signal output by the data selector circuit 204. For example, if the data selector circuit 204 outputs a data signal from data source 1, then the source clock selector circuit 304 may select for output the corresponding source clock signal, denoted as src_clk1. If the data selector circuit 204 outputs a data signal from data source 2, then the source clock selector circuit 304 may select for output the corresponding source clock signal, denoted as src_clk2. If the data selector circuit 204 outputs a data signal from data source N, then the source clock selector circuit 304 may select for output the corresponding source clock signal, denoted as src_clkN.

A second clock signal input may be the clock signal for the next clock domain. In this case, the next clock domain is the on-chip logic analyzer (OLA) domain 400, so the second clock signal input is the clock signal for the OLA domain, denoted as OLA_clk.

As indicated, the source buffering circuitry 300 effectively implements a clock domain crossing, where the clock domain for the data signal changes from the source clock to the OLA clock. This advantageously enables the OLA circuitry to operate on source signals with a variety of clocks.

Figure 4:
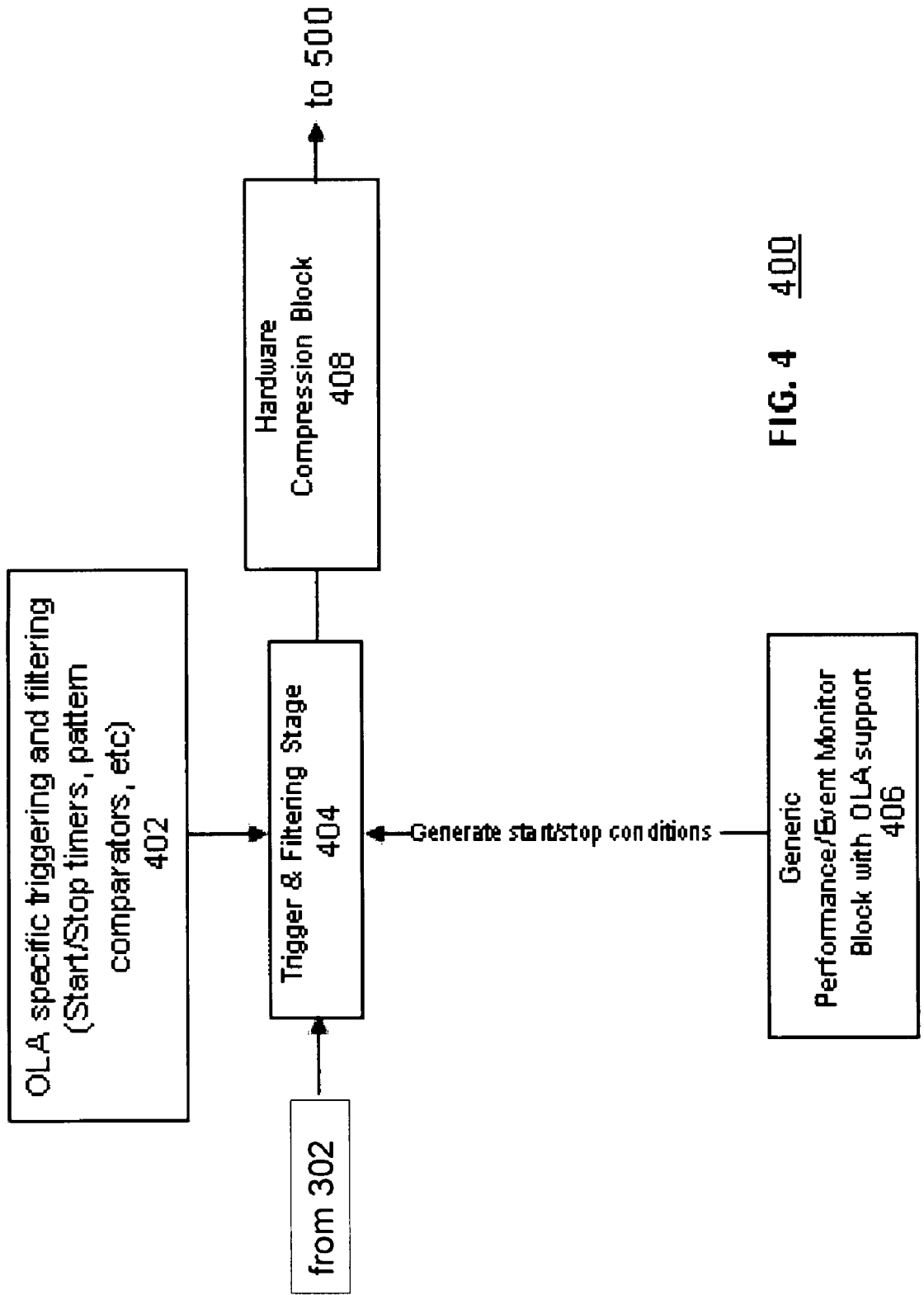
FIG. 4 is a schematic diagram of on-chip logic analyzer (OLA) clock domain circuitry in accordance with an embodiment of the invention.

FIG. 4 is a schematic diagram of on-chip logic analyzer (OLA) clock domain circuitry 400 in accordance with an embodiment of the invention. As depicted, a triggering and filtering stage 404 receives the buffered data signal from the source buffering circuit 302 of FIG. 3.

The triggering and filtering stage 404 also receives input signals relating to the generation of start/stop conditions from a generic performance/event monitor block with OLA support 406. The triggering and filtering stage 404 further receives start/stop timing signals, pattern comparators, and other signals pertaining to triggering and filtering from an OLA specific triggering and filtering block 402. The triggering circuitry in the block 402 may comprise dedicated triggering logic. Advantageously, users may trigger on-chip performance monitor events to enable the signal being captured by utilizing the aforementioned circuitry. Furthermore, users may filter unnecessary capture cycles to increase capture bandwidth. For example, optional time stamps may be inserted for time reconstruction.

The hardware compression block 408 is configured to receive the data signal output by the triggering and filtering stage 404 and to compare un-changed states in the signal for the purpose of compressing the information in the signal. The compressed data signal is output by the hardware compression block 408 to the destination buffering circuitry 500.

In accordance with an embodiment of the invention, the compression technique may be a lossless compression technique. More particularly, a specific embodiment of the compression technique uses a variant of run-length encoding utilizing partial compression bit-width W. In this embodiment, the compression block 408 may be configured to perform the following steps and functionalities.

1) The group of signals to be compressed may be divided into L compression lanes of W bit wide each. For example, a 32-bit capture bus may be divided into L=2 compression lanes which are each W=16 bits wide. A higher number of L compression lanes would typically provide for higher compression ratios. However, implementation is typically simpler and more straightforward with fewer lanes, for example, L=2 lanes. L=1 would correspond to a typical (single lane) run-length encoding scheme.

2) Within each compression lane, a compression buffer may be configured to compare the current data with previous data. If the comparison indicates that the data are the same, then an encoded sequence will be output and a counter will keep track of the length of the recurring data pattern. Otherwise, the uncompressed data may be output.

3) The circuitry may be configured such that the minimum number of unchanged data cycles to be encoded may be a function of (i.e. is set to be longer than) the number of cycles of an escape sequence for the system.

4) The circuitry may be configured such that when one lane is in compressed mode and another lane is in un-compressed mode, data is moved from the uncompressed lane to the compressed lane so as to more efficiently keep the bandwidth of both lanes utilized and hence increase effective capture bandwidth.

The above-described partial lane compression scheme takes advantage of the fact that certain groups of signals, such as data bus signals and state signals, are more likely to remain static than others. Those signals are more likely to remain static will have a higher affinity to run-length encoding. The selection of the W and L parameters substantially affects the compression performance for a particular implementation.

Figure 5:
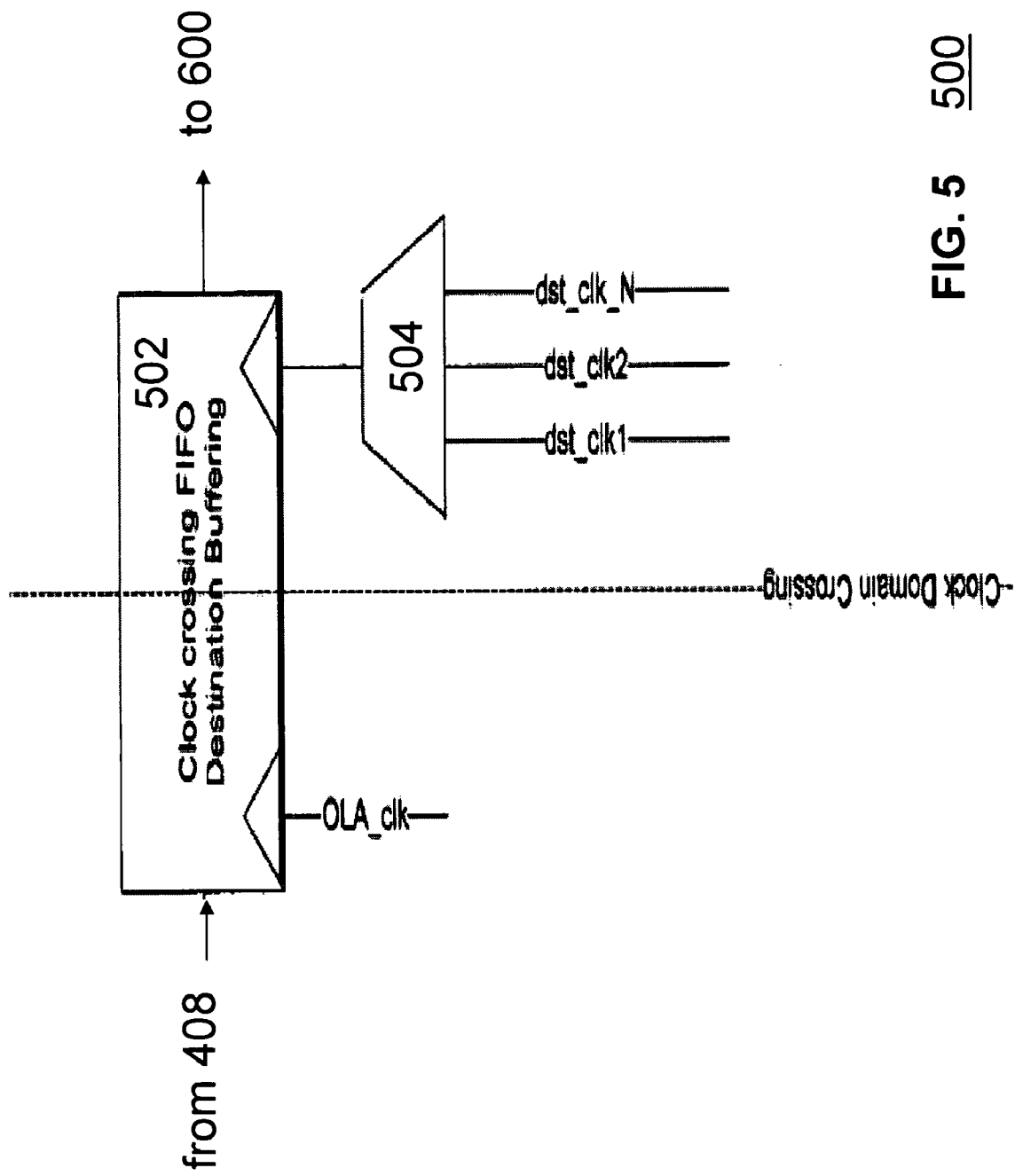
FIG. 5 is a schematic diagram of destination buffering circuitry in accordance with an embodiment of the invention.

FIG. 5 is a schematic diagram of destination buffering circuitry 500 in accordance with an embodiment of the invention. As depicted, a clock crossing first-in-first-out (FIFO) destination buffering circuit 502 receives the compressed data signal output by the hardware compression block 408 of FIG. 4. The FIFO destination buffering circuit 502 also receives two clock signal inputs.

A first clock signal input may be the clock signal from the OLA domain, denoted as OLA_clk. A second clock signal input may be received from a destination clock selector circuit 504, where the destination clock selector circuit 504 may output a destination clock signal which corresponds to the clock signal of a selected capture device 602. For example, if a first capture device 602-1 is selected, then the destination clock selector circuit 504 may select for output the corresponding destination clock signal, denoted as dst_clk1. If a second capture device 602-2 is selected, then the destination clock selector circuit 504 may select for output the corresponding destination clock signal, denoted as dst_clk2. More generally, if the Nth capture device 602-N is selected, then the destination clock selector circuit 504 may select for output the corresponding destination clock signal, denoted as dst_clkN.

As indicated, the destination buffering circuitry 500 effectively implements a clock domain crossing, where the clock domain for the compressed data signal changes from the OLA clock to the destination clock. This advantageously enables the OLA circuitry to output signals which are compatible with clock rates of a variety of capture devices.

Figure 6:
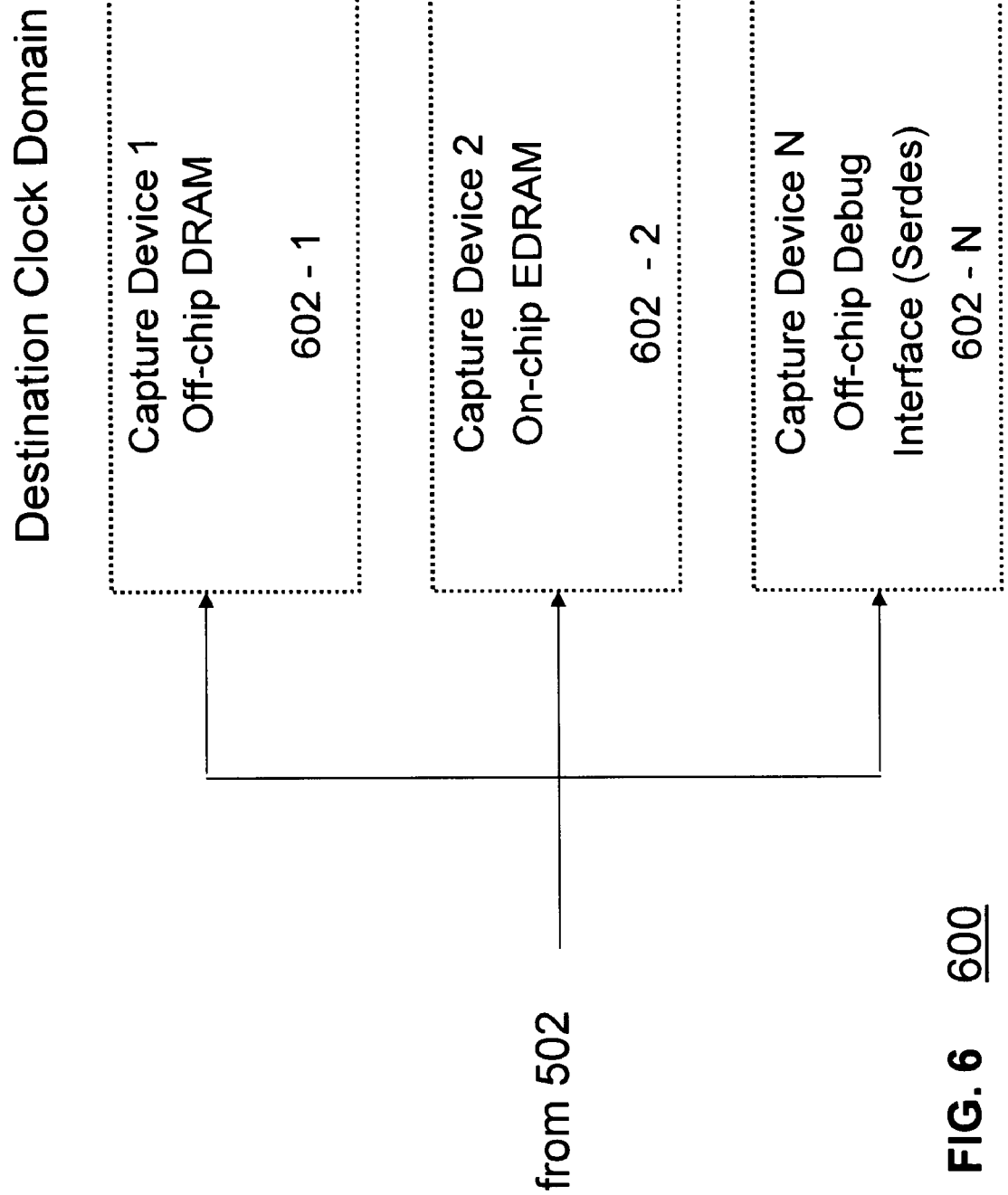
FIG. 6 is a schematic diagram of destination clock domain circuitry in accordance with an embodiment of the invention.

FIG. 6 is a schematic diagram of destination clock domain circuitry 600 in accordance with an embodiment of the invention. As shown, the destination clock domain circuitry may pertain to various different capture devices 602-1 through 602-N, where each capture device 602 may have its own clock domain. The capture devices 602 may be off-chip or on-chip. For example, capture device 1 602-1 may be an off-chip DRAM (dynamic random access memory) unit. Capture device 2 602-2 may be an on-chip EDRAM (embedded DRAM) unit. And so on. As another example, capture device N 602-N may be an off-chip debug interface, including a serializer-deserializer (serdes).

Output of a signal which is compatible with a specific capture 602 may be supported by selection of the corresponding clock signal by the destination clock selector 504 of FIG. 5. Advantageously, this enables writing the compressed data to a variety of possible capture devices, including to off-chip DRAM, on-chip EDRAM, or off-chip debug interfaces.

Once the compressed data is accessed from the chip and, for example, stored in off-chip DRAM, a software application may be utilized to read and uncompress the data for user analysis.

The compression algorithm outlined for compressing the logic analyzer data source is a variance of a run-length encoding based scheme configured or optimized for this particular application. Run length encoding in general is better suited for simple hardware implementation and works reasonably well for compressing internal chip states due to chip states being inherently static (states in IDLE, NOP or WAIT, etc.).

Figure 7:
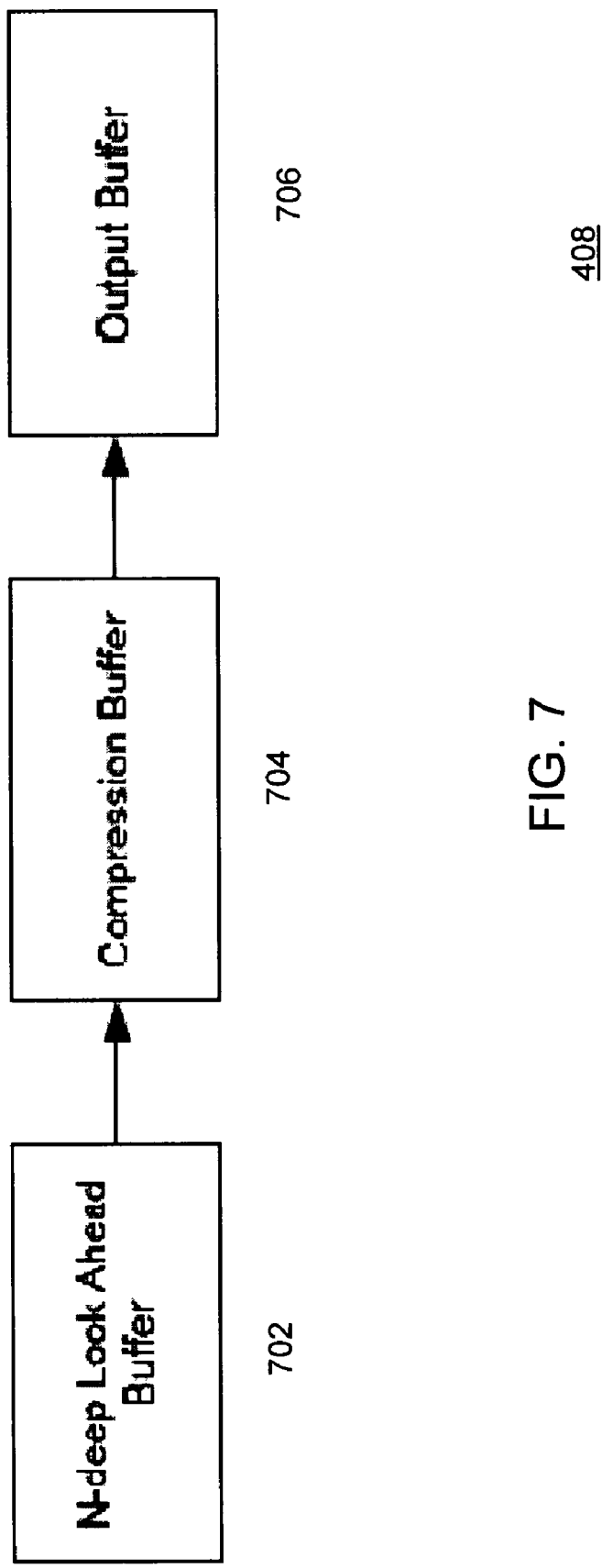
FIG. 7 is a schematic diagram of OLA hardware compression logic in accordance with an embodiment of the invention.

FIG. 7 is a schematic diagram of OLA hardware compression logic 408 in accordance with an embodiment of the invention. A compression buffer 704 of size M (M=4 typical) with a look ahead buffer 702 of size N. The look ahead buffer 702 is used to allow for matching of more than one data word. Data is sent from the compression buffer 704 to an output buffer 706.

Figure 8:
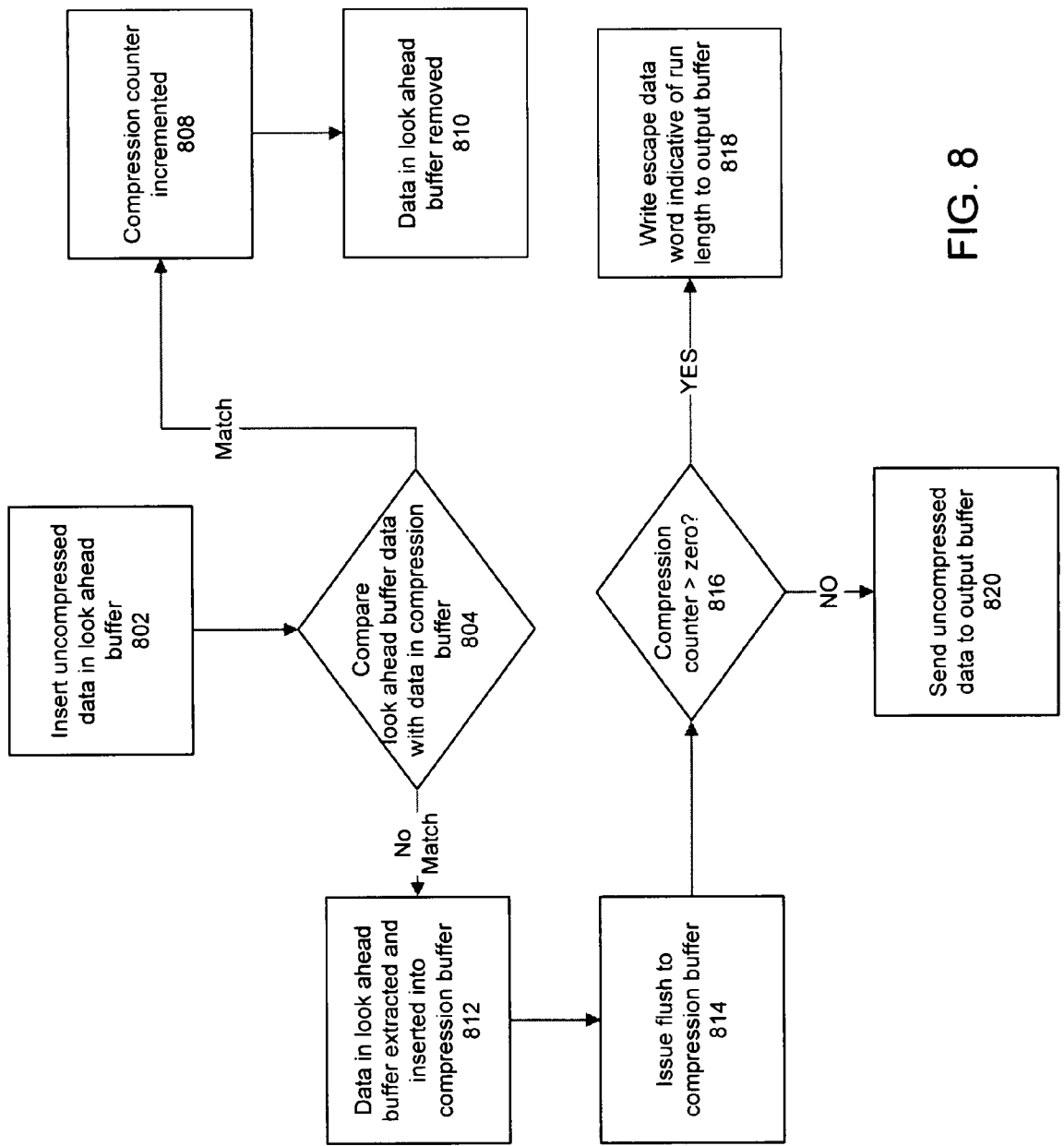
FIG. 8 is a flow chart depicting select steps of a compression procedure for an on-chip logic analyzer in accordance with an embodiment of the invention.

FIG. 8 is a flow chart depicting select steps of a compression procedure for an on-chip logic analyzer in accordance with an embodiment of the invention. Uncompressed data is inserted 802 into the look-ahead buffer. The look ahead buffer data is compared 804 to the data in the compression buffer.

If a match exists, then compression may be deemed worthwhile and so a compression counter is incremented 808, and the matched data in the look ahead buffer is removed. On the other hand, if there is no match, then the data in the look ahead buffer is extracted and inserted into the compression buffer 812, and a flush is issued to the compression buffer 814.

After the compression flush 814, the compression counter is checked 816 to see if the value is greater than zero. If the compression counter is greater than zero on a compression flush, then an "escape" data word is written 818 to the output buffer. Otherwise, the uncompressed data is sent 820 to the output buffer.

Depending on the data (word) width of the compression lane (which may be, for example, 16-bit), a single escape data word may be defined to indicate number of times to replicate the data. In other words, the escape word may be defined to be indicative of the run length of the repetitive data.

In one implementation, the escape data word may contain the following fields: an escape ID; and a compression counter. For instance, in a 16-bit escape data word, the escape ID maybe a 10-bit field with a compression counter of 6-bit wide. This escape data word definition allows for a run-length of 64 maximum and defines the theoretical max compression ratio of 64 to 1.

The escape ID needs to be unique such that the uncompressed data will not be matched to the escape ID to be mis-identified as the escape data word. A running escape ID need to be kept such that an escape data word with a compression counter of zero is generated in the case where escape ID matches uncompressed data. This is, in effect, a double escape sequence.

The compression counter width sets the maximum compression ratio of the particular implementation of the algorithm. Since the generation of an Escape Word is an overhead, it is desirable to minimize the size of the escape word and the probability for escape ID collision with the input data stream. Escape ID collision is when the escape ID field matches the input data stream, requiring the generation of an escape word with compression count of zero. The following are three example schemes (constant escape ID, scrambling escape ID, and adaptive escape ID) for implementing the escape ID in accordance with embodiments of the invention.

1. Constant Escape ID

The probability for an escape ID collision for a constant escape ID is $1/(2^k)$. For a 10-bit escape ID (k=10), there is a 1/1024 chance that a double escape sequence need to be output even on uncompressed data, assuming the data is uniform random. The upside is that a constant escape ID is easy to implement.

2. Scrambling Escape ID

An enhanced version of a constant escape ID scheme is a running escape ID generation based on previous output data. Such scrambled escape ID may be reconstructed in decompression time and may potentially decrease the escape collision probability down to $(1/2^k)^2$. For instance, the scrambling may be implemented using a hash function based on known parameters during decompression, such as current data word count, previous data history, etc. This technique preferably scrambles even a potentially low transition density uncompressed data stream. Such scrambling/hash function is relatively easy to implement in hardware circuitry but yet produce the desired characteristics of random escape ID output even on a static input data stream.

3. Adaptive Escape ID

Since both the compression and decompression processes know when there is a double escape sequence, one may also use an adaptive algorithm to only change the escape ID if we detected a predefined number of escape ID collision.

Figure 9:
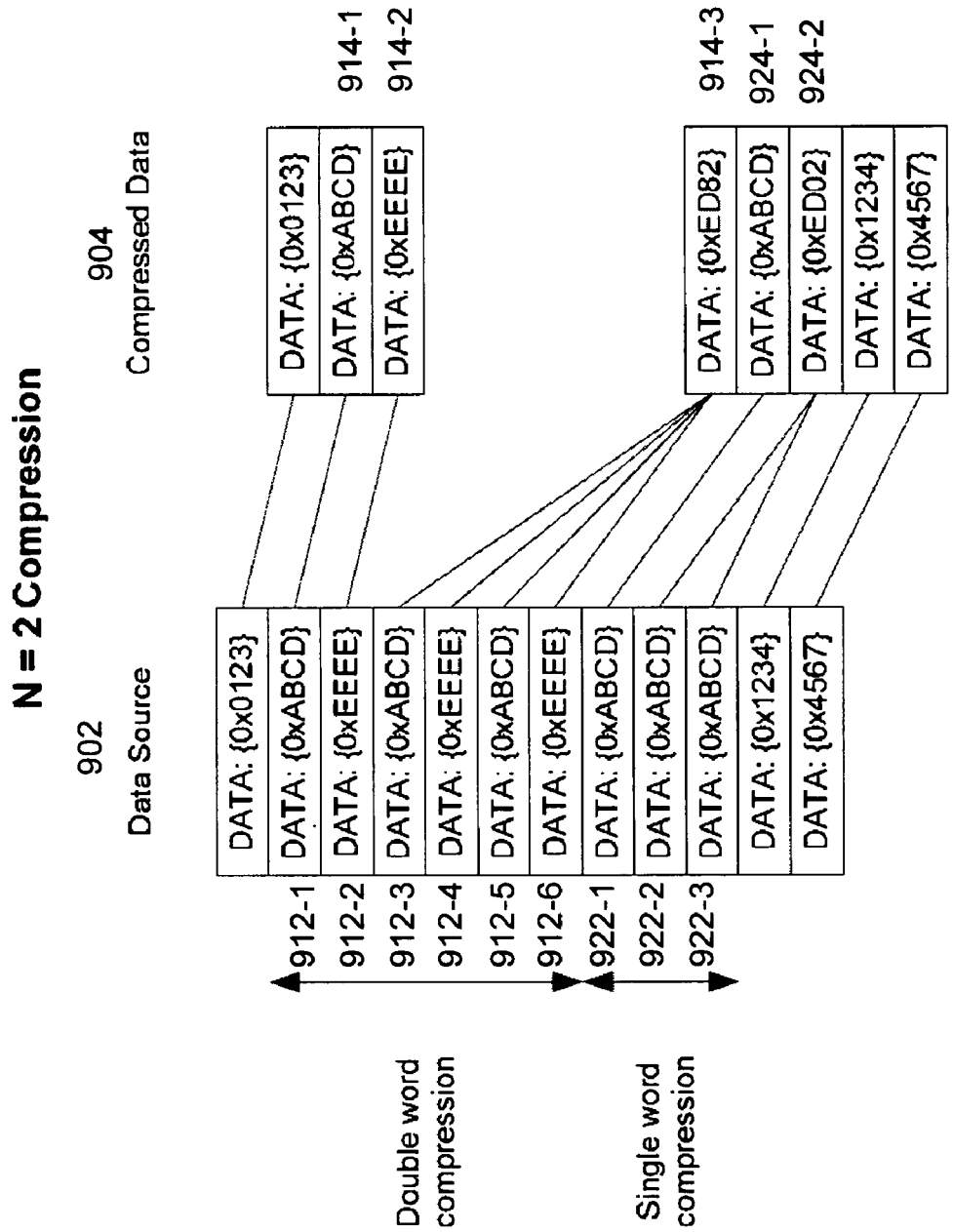
FIG. 9 is a diagram depicting an example of compression with a 2-deep look-ahead buffer in accordance with an embodiment of the invention.

FIG. 9 is a diagram depicting an example of compression with a 2-deep (N=2) look-ahead buffer in accordance with an embodiment of the invention. An N=2 look ahead buffer allows for compressing data that repeats every other cycle, such as a toggle value. Also, N=2 will generally compress well against the case where the input data stream is actually a packed version of the compression word. For instance, if the input data stream at 16-bit wide is actually a packed version of a 32-bit wide data source into two 16-bit words, the two-deep look-ahead buffer enables the compression algorithm to recognize this packing.

An illustrative sequence of a data source (of uncompressed data) 902 and a corresponding sequence of compressed data 904 are shown in FIG. 9. The example data source sequence includes a 6-word sequence of three repetitive double words (912-1 through 912-6). The corresponding sequence in the compressed data is a 3-word sequence including a single copy of the double word (914-1 and 914-2) and an escape data word 914-3 which indicates that the compression counter is two (i.e. that the total run length of the double word sequence is three).

The example data source sequence also includes a 3-word sequence of three repetitive single words (922-1 through 922-3). The corresponding sequence in the compressed data is a 2-word sequence including a single copy of the single word (924-1) and an escape data word 924-2 which indicates that the compression counter is two (i.e. that the total run length of the single word sequence is three). Note also that a bit in the escape data word will be used (bit 7 in this example) to indicate whether to repeat the last data only or repeat the last two data words.

Figure 10:
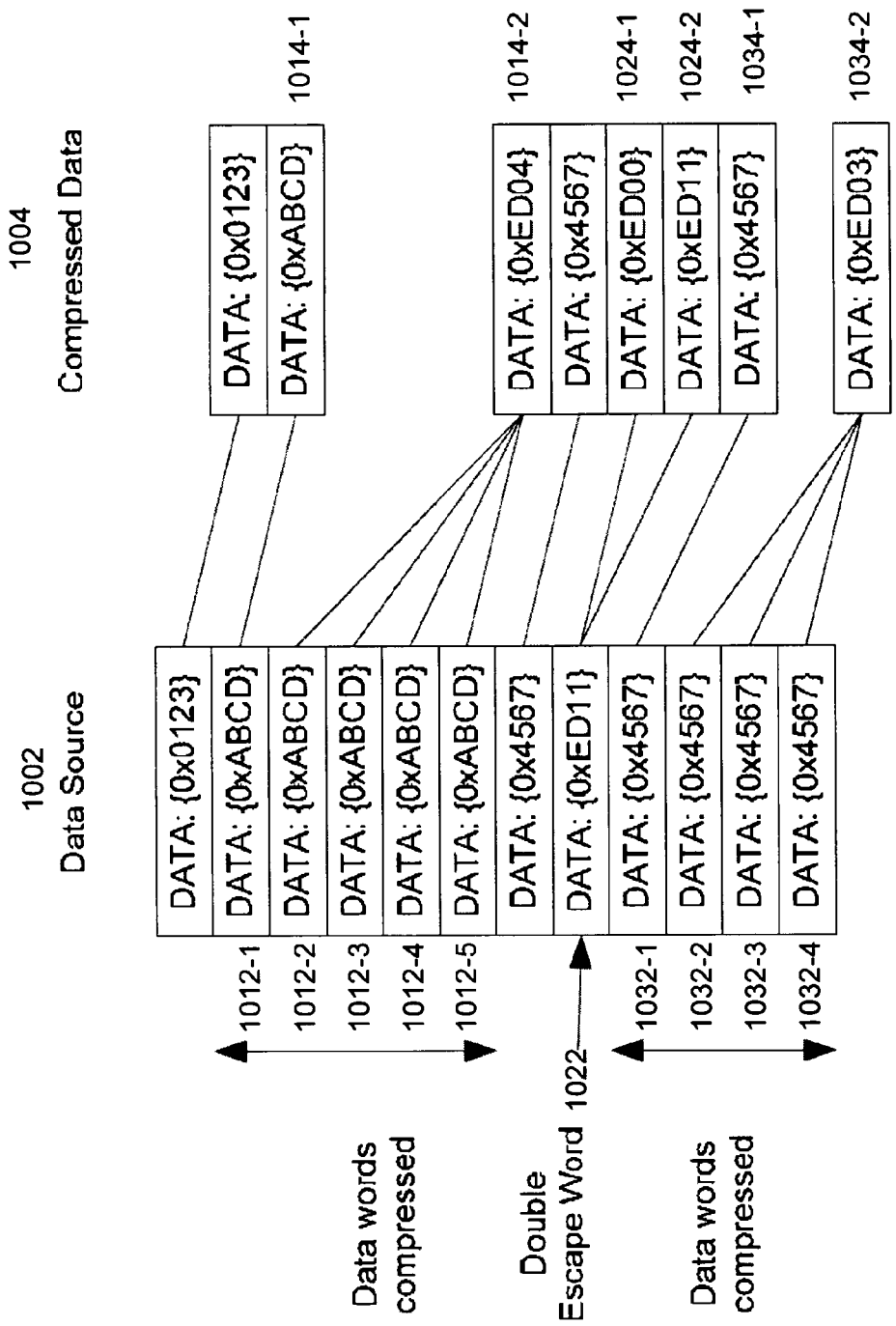
FIG. 10 is a diagram depicting an example of compression with a 1-deep look-ahead buffer in accordance with an embodiment of the invention.

FIG. 10 is a diagram depicting an example of compression with a 1-deep (N=1) look-ahead buffer in accordance with an embodiment of the invention. An N=1 look ahead buffer is limited to compressing data that repeats every cycle.

An illustrative sequence of a data source (of uncompressed data) 1002 and a corresponding sequence of compressed data 1004 are shown in FIG. 10. The example data source sequence includes a 5-word sequence of five repetitive single words (1012-1 through 1012-5). The corresponding sequence in the compressed data is a 2-word sequence including a single copy of the word (1014-1) and an escape data word 1014-2 which indicates that the compression counter is four (i.e. that the total run length of the sequence is five).

The example data source sequence also includes uncompressed data word 1022 which matches an escape data word in the data source 1002. In accordance with an embodiment of the invention, this is converted to a double escape word in the compressed data 1004. As shown, the double escape word may have a first word 1024-1 which is an escape word indicating a compression counter of zero, and a second word 1024-2 which is a copy of the original uncompressed data word 1022.

The example data source sequence also includes a 4-word sequence of four repetitive single words (1032-1 through 1032-4). The corresponding sequence in the compressed data is a 2-word sequence including a single copy of the word (1034-1) and an escape data word 1034-2 which indicates that the compression counter is three (i.e. that the total run length of the sequence is four).

In conclusion, chip defect analysis frequently requires the triggering and capture of large amounts of on-chip state information. The present application utilizes on-chip resources effectively to increase data captured at minimal cost. Data may be selected by way of a debug/monitor bus and may be triggered by performance counter events. The data may be compressed to substantially increase the amount of information captured and the compressed data may then be sent to DRAM.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An integrated circuit on a semiconductor substrate, the integrated circuit comprising:
    on-chip logic analyzer circuitry associated with an on-chip analyzer clock signal and including a triggering circuit configured to receive a source data signal and further including a compression circuit configured to receive an uncompressed data signal from the triggering circuit and to perform compression to form a compressed data signal from the uncompressed data signal; and
    destination buffering circuitry to receive the compressed data signal and to convert a timing of the compressed data signal from a timing of the on-chip analyzer clock signal to a timing of a particular destination clock signal of a particular capture device, wherein the destination buffering circuitry is configured to select one of plural different destination clock signals as the particular clock signal, depending upon which of plural capture devices is selected as the particular capture device to store the compressed data signal.

2. The integrated circuit of claim 1, further comprising:
    a clock crossing source buffering circuit configured to convert timing of the source data signal from a timing of a source clock signal to the timing of the on-chip logic analyzer clock signal, wherein the clock crossing source buffering circuit is configured to provide the source data signal to the on-chip logic analyzer circuit.

3. The integrated circuit of claim 2, further comprising a first selector circuit for selecting said source data signal from a plurality of source data signals and a second selector circuit for selecting said source clock signal from a plurality of source clock signals corresponding to the plurality of source data signals, wherein the selected source clock signal is associated with the selected source data signal.

4. The integrated circuit of claim 1, wherein the triggering circuit is configured to trigger capturing of the source data signal.

5. The integrated circuit of claim 4, wherein said capturing of the source data signal is triggered in response to on-chip events of the integrated circuit.

6. The integrated circuit of claim 1, wherein the on-chip logic analyzer circuitry further includes a filtering circuit configured to filter certain capture cycles from the source data signal.

7. The integrated circuit of claim 1, wherein the compression circuit is configured to divide the source data signal into a plurality of compression lanes.

8. The integrated circuit of claim 1, wherein the destination buffering circuitry includes a selector having inputs to receive the plural destination clock signals, wherein the selector is configured to select one of the plural destination clock signals as the particular destination clock signal, wherein the plural destination clock signals correspond to the plural capture devices that include an on-chip storage device that is part of the integrated circuit, and an off-chip storage device that is separate from the integrated circuit.

9. An integrated circuit on a semiconductor substrate, the integrated circuit comprising on-chip logic analyzer circuitry including a triggering circuit configured to receive a source data signal and start/stop timing signals and further including a compression circuit configured to receive an uncompressed data signal from the triggering circuit and to perform compression so as to form a compressed data signal, wherein the compression circuit is configured to divide the source data signal into a plurality of compression lanes, wherein the compression circuit is further configured such that when one lane is in compressed mode and another lane is in un-compressed mode, data is moved from the lane in un-compressed mode to the lane in compressed mode.

10. The integrated circuit of claim 9, wherein the compression circuit is configured to perform lossless compression.

11. The integrated circuit of claim 10, wherein the lossless compression uses run-length encoding.

12. The integrated circuit of claim 11, wherein the run-length encoding is implemented using an escape data word and a double escape data word for when the escape data word is in the uncompressed data signal.

13. A method for use in an integrated circuit, the method comprising:
    selecting a source data signal;
    generating an uncompressed data signal from the source data signal;
    performing, using on-chip analyzer circuitry associated with an on-chip logic analyzer clock signal in the integrated circuit, compression on the uncompressed data signal to generate a compressed data signal;
    selecting one of plural capture devices;
    selecting one of plural different destination clock signals corresponding to the selected capture device;
    converting, by destination buffering circuitry in the integrated circuit, timing of the compressed data signal from a timing of the on-chip analyzer clock signal to a timing of the selected destination clock signal; and
    providing, by the destination buffering circuitry, the compressed data signal after converting the timing to the selected capture device for storing.

14. The method of claim 13, wherein the source data signal is received by the on-chip analyzer circuitry from a clock crossing source buffering circuit which converts timing of the source data signal from a timing of a source clock signal to a timing of the on-chip logic analyzer clock signal.

15. The method of claim 14, further comprising selecting said source data signal from a plurality of source data signals and selecting said source clock signal from a plurality of source clock signals corresponding to the plurality of source data signals, wherein the selected source clock signal is associated with the selected source data signal.

16. The method of claim 13 further comprising triggering capture of the source data signal using on-chip events of the integrated circuit.

17. The method of claim 13 further comprising filtering certain capture cycles from the source data signal.

18. The method of claim 13 further comprising dividing the source data signal into a plurality of compression lanes.

19. The method of claim 13, wherein the plural capture devices include an on-chip storage device that is part of the integrated circuit, and an off-chip storage device that is separate from the integrated circuit.

20. A method for use in an integrated circuit, the method comprising:
  selecting a source data signal;
  receiving start/stop timing signals;
  generating an uncompressed data signal from the source data signal and the start/stop timing signals;
  performing compression on the uncompressed data signal to generate a compressed data signal;
  outputting the compressed data signal from the integrated circuit;
  dividing the source data signal into a plurality of compression lanes; and
  when one lane is in compressed mode and another lane is in un-compressed mode, transferring data from the lane in un-compressed mode to the lane in compressed mode.

21. The method of claim 20, wherein the compression comprises lossless compression.

22. The method of claim 21, wherein the lossless compression applies run-length encoding.

23. The method of claim 22, wherein the run-length encoding is implemented using an escape data word and a double escape data word for when the escape data word is in the uncompressed data signal.

24. The method of claim 23, wherein escape identifier (escape ID) collisions are controlled by using a constant escape ID.

25. The method of claim 23, wherein escape identifier (escape ID) collisions are controlled by using a scrambling escape ID.

26. The method of claim 23, wherein escape identifier (escape ID) collisions are controlled by using an adaptive escape ID.

27. An integrated circuit comprising:
  circuitry configured to select a source data signal;
  circuitry configured to receive start/stop timing signals;
  on-chip analyzer circuitry associated with an on-chip analyzer clock signal and comprising:
    trigger circuitry configured to generate an uncompressed data signal from the source data signal and the start/stop timing signals, and
    compression circuitry configured to perform compression on the uncompressed data signal to generate a compressed data signal; and
  destination buffering circuitry configured to:
    select one of plural capture devices;
    select one of plural different destination clock signals corresponding to the selected capture device;
    convert timing of the compressed data signal from a timing of the on-chip analyzer clock signal to a timing of the selected destination clock signal; and
    provide the compressed data signal after converting the timing to the selected capture device for storing.

28. The integrated circuit of claim 27, wherein the plural capture devices include an on-chip storage device that is part of the integrated circuit, and an off-chip storage device that is separate from the integrated circuit.

* * * * *